United States Patent
Cheng et al.

(10) Patent No.: US 9,455,314 B1
(45) Date of Patent: Sep. 27, 2016

(54) Y-FET WITH SELF-ALIGNED PUNCH-THROUGH-STOP (PTS) DOPING

(71) Applicant: International Business Machines Corporation, Armonk, NY (US)

(72) Inventors: Kangguo Cheng, Schenectady, NY (US); Ramachandra Divakaruni, Ossining, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/016,839

(22) Filed: Feb. 5, 2016

(51) Int. Cl.
| H01L 29/06 | (2006.01) |
| H01L 27/088 | (2006.01) |
| H01L 29/66 | (2006.01) |
| H01L 21/762 | (2006.01) |

(52) U.S. Cl.
CPC ..... *H01L 29/0638* (2013.01); *H01L 21/76237* (2013.01); *H01L 27/0886* (2013.01); *H01L 29/0649* (2013.01); *H01L 29/66795* (2013.01)

(58) Field of Classification Search
CPC .............. H01L 29/0638; H01L 29/66795; H01L 29/0649; H01L 27/0886; H01L 21/76237
See application file for complete search history.

(56) References Cited

U.S. PATENT DOCUMENTS

| 7,679,134 B1 | 3/2010 | Buynoski et al. |
| 8,258,572 B2 | 9/2012 | Liaw |
| 8,907,410 B2 | 12/2014 | Kothandaraman et al. |
| 8,946,033 B2 | 2/2015 | Adam et al. |
| 8,987,835 B2 | 3/2015 | Vellianitis et al. |
| 9,082,853 B2 | 7/2015 | Cheng et al. |
| 2010/0163971 A1* | 7/2010 | Hung ............. H01L 29/66795 257/327 |
| 2015/0001630 A1 | 1/2015 | Singh |

OTHER PUBLICATIONS

Wang, J. G., et al., "0.15uM Y-Gate pHEMT Process Using Deep-UV Phase-Shift Lithography", Compound Semiconductor Integrated Circuit Symposium (CSICS), IEEE, Oct. 16-19, 2011, pp. 1-4.

* cited by examiner

*Primary Examiner* — Roy Potter
*Assistant Examiner* — Paul Patton
(74) *Attorney, Agent, or Firm* — Scully, Scott, Murphy & Presser, P.C.; Jennifer R. Davis, Esq.

(57) ABSTRACT

A semiconductor structure is provided that includes at least one punch-through stop base structure having concave outermost sidewalls and located on a semiconductor surface of a semiconductor substrate. The structure further includes a pair of semiconductor fins extending upwards from a topmost surface of the at least one punch through stop base structure. The structure even further includes a trench isolation structure located laterally adjacent each of the concave outermost sidewalls of the at least one punch-through stop base structure, wherein a dopant source dielectric material liner is located on each of the concave outermost sidewalls of the at least one punch-through stop base structure and is present between the at least one punch-through stop base structure and the trench isolation structure.

20 Claims, 5 Drawing Sheets

Y-FET WITH SELF-ALIGNED PUNCH-THROUGH-STOP (PTS) DOPING

BACKGROUND

The present application relates to a semiconductor structure and a method of forming the same. More particularly, the present application relates to a semiconductor structure including a pair of semiconductor fins located on a punch-through stop base structure having concave outermost sidewalls. The present application also provides a method of forming such a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

For 10 nm technology and beyond, source-drain leakage current may become a challenge for bulk FinFET electrostatics. Punch-through stop (PTS) doping can be implemented to form sub-Fin PTS structures to reduce such leakage current. However, traditional direct ion implantation processes currently employed in forming sub-fin PTS structures cause Fin crystalline damage which, in turn, leads to unwanted defects in the channel region of the resultant FinFET device. There is thus a need for providing semiconductor structure containing sub-fin PTS structures in which crystalline damage is circumvented.

SUMMARY

One aspect of the present application relates to a semiconductor structure. In one embodiment of the present application, the semiconductor structure includes at least one punch-through stop base structure having concave outermost sidewalls and located on a semiconductor surface of a semiconductor substrate. The structure of the present application further includes a pair of semiconductor fins extending upwards from a topmost surface of the at least one punch through stop base structure. The structure of the present application even further includes a trench isolation structure located laterally adjacent each of the concave outermost sidewalls of the at least one punch-through stop base structure, wherein a dopant source dielectric material liner is located on each of the concave outermost sidewalls of the at least one punch-through stop base structure and is present between the at least one punch-through stop base structure and the trench isolation structure. Collectively, the pair of semiconductor fins and the at least one punch-through stop base structure provide a "Y-shaped fin structure" of the present application.

Another aspect of the present application relates to a method of forming a semiconductor structure. In one embodiment of the present application, the method includes forming at least one pair of semiconductor fins extends upwards from a semiconductor surface of a semiconductor substrate, wherein each semiconductor fin of the at least one pair of semiconductor fins is separated by a gap. A dielectric spacer is then formed along sidewalls of each semiconductor fin of the at least one pair of semiconductor fins, wherein a dielectric material portion of the dielectric spacer covers an entirety of the semiconductor surface of the semiconductor substrate within the gap. Exposed portions of the semiconductor substrate are then removed to provide a semiconductor base having concave outermost sidewalls located beneath the at least one pair of semiconductor fins utilizing the dielectric spacer as an etch mask. Next, a dopant source dielectric material portion is formed on each of the concave outermost sidewall of each semiconductor base. A trench isolation structure is then formed laterally adjacent each semiconductor base, wherein the dopant source dielectric material portion separates the trench isolation structure from the semiconductor base. Next, dopant from each dopant source dielectric material portion is diffused into the semiconductor base to convert the semiconductor base into a punch-through stop base structure. Since the punch-through stop base structure is not formed utilizing any direct ion implantation process, but instead a solid phase doping scheme as mentioned above is used, a sub-fin PTS structure (i.e., the punch-through stop base structure) is provided in which crystalline damage is circumvented.

DETAILED DESCRIPTION

Figure 1:
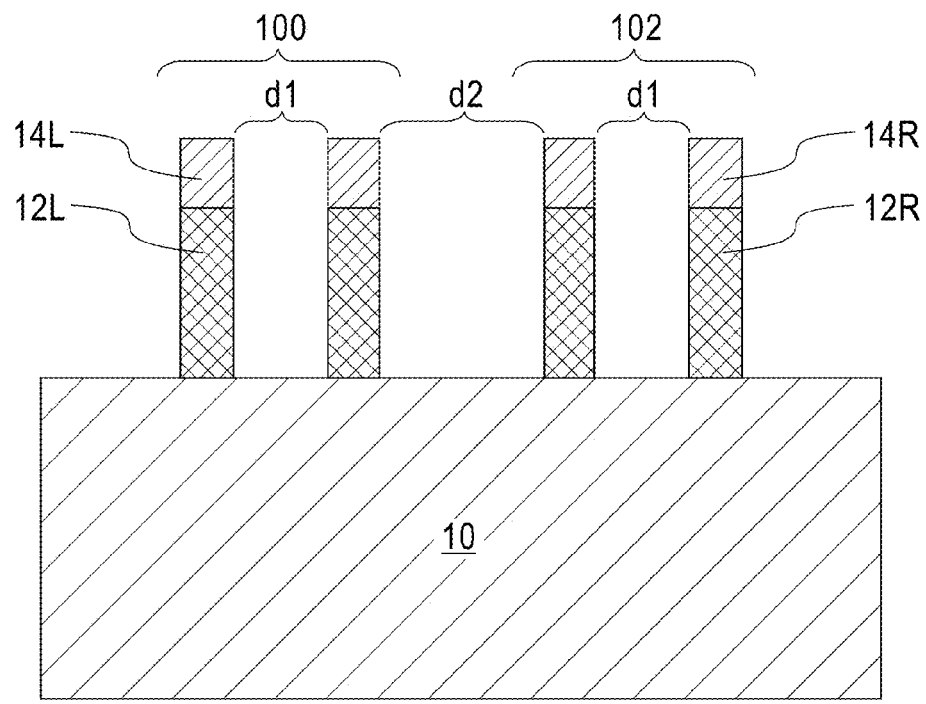
FIG. 1 is a cross sectional view of an exemplary semiconductor structure including a first pair of first semiconductor fins and a second pair of second semiconductor fins extending upwards from a surface of a semiconductor substrate, each first semiconductor fin is capped with a first hard mask cap and each second semiconductor fin is capped with a second hard mask cap.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. Notably, FIG. 1 shows a first pair of first semiconductor fins 12L and a second pair of second semiconductor fins 12R extending upwards from a surface of a semiconductor substrate 10, each first semiconductor fin 12L is capped with a first hard mask cap 14L and each second semiconductor fin 12R is capped with a second hard mask cap 14R. Each first semiconductor fin 12L is present in a first device region 100 and each second semiconductor fin 12R is formed in a second device region 102. In some embodiments, only a pair of semiconductor fins is formed.

As is shown, each pair of semiconductor fins (12L or 12R) is separated by a first distance, d1, while the first pair of semiconductor fins 12L is separated from the second pair of semiconductor fins 12R by a second distance, d2. In accordance with the present application, the first distance, d1, is less than the second distance, d2. In one example, the first distance, d1, may be within a range from 10 nm to 30 nm, while the second distance, d2, may be within a range from 20 nm to 40 nm, with the proviso that d2 is greater than d1. It is noted that d1 defines a first gap that is present between one pair of semiconductor fins 12L or 12R within a particular device region (i.e., first device region 100 or second device region 102), while d2 defines a second gap that is present between the semiconductor fins in different device regions.

The exemplary semiconductor structure shown in FIG. 1 can be formed by first providing a hard mask layer on a surface of a bulk semiconductor substrate. The term "bulk semiconductor substrate" is used throughout the present application to denote a substrate that is composed entirely of a semiconductor material; no insulator materials or conductive materials are present within the bulk semiconductor substrate.

The bulk semiconductor substrate that can be employed in the present application may include at least one semiconductor material that has semiconducting properties. Examples of semiconductor materials that have semiconducting properties and thus can be used as the bulk semiconductor substrate include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the bulk semiconductor substrate is entirely composed of silicon.

The bulk semiconductor substrate that may be employed in the present application is a single crystalline material. The bulk semiconductor substrate may have any of the well known crystal orientations. For example, the crystal orientation of the bulk semiconductor substrate may be {100}, {110} or {111}.

The hard mask layer that is present on the surface of the bulk semiconductor substrate is a contiguous layer that covers the entirety of the bulk semiconductor substrate. The hard mask layer that is employed in the present application may include an oxide, a nitride and/or an oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride.

In some embodiments, the hard mask material that can be used in providing the hard mask layer can be formed by a deposition process such as, for example, chemical vapor deposition (CVD) or plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process. The thickness of the hard mask material that can be used in providing the hard mask layer can range from 10 nm to 40 nm. Other thicknesses that are lesser than, or greater than, the aforementioned thickness range may also be employed as the thickness of the hard mask layer.

After providing the hard mask layer on the bulk semiconductor substrate, the hard mask layer and an upper semiconductor material portion of the bulk semiconductor substrate is patterned. Each remaining portion of the hard mask layer is referred to herein as a hard mask cap (14L, 14R), each remaining upper semiconductor portion of the bulk semiconductor substrate is referred to herein as a semiconductor fin (first semiconductor fins 12L and second semiconductor fins 12R), and the remaining portion of the bulk semiconductor substrate is referred to herein as semiconductor substrate 10.

In one embodiment of the present application, the patterning process used to define the semiconductor fins (12L, 12R) and hard mask caps (14L, 14R) may include a sidewall image transfer (SIT) process. The SIT process includes forming a contiguous mandrel material layer (not shown) on the topmost surface of the hard mask layer. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the surface of the hard mask layer.

The SIT process continues by forming a spacer on each sidewall of each mandrel structure. The spacer includes any spacer material such as a dielectric material that has a different etch rate than the mandrel material layer. Each spacer can be formed by deposition of a spacer material and then etching the deposited spacer material. In one embodiment, the spacer material may comprise any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching. Since the spacers are used in the SIT process as an etch mask, the width of the each spacer determines the width of each semiconductor fin.

After formation of the spacers, the SIT process continues by removing each mandrel structure. Each mandrel structure can be removed by an etching process that is selective for removing the mandrel material as compared to the material of the spacers and the hard mask layer. Following the mandrel structure removal, the SIT process continues by transferring the pattern provided by the spacers into the hard mask layer and then into the bulk semiconductor substrate. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In another embodiment of the present application, the patterning process used to define the semiconductor fins (12L, 12R) and hard mask caps (14L, 14R) may include lithography and etching. It yet another embodiment, a direct self-assembly (DSA) process can be used as the patterning process used to define the semiconductor fins (12L, 12R) and hard mask caps (14L, 14R).

As used herein, a "fin" refers to a contiguous structure including a semiconductor material and including a pair of vertical sidewalls that are parallel to each other. As used herein, a surface is "vertical" if there exists a vertical plane from which the surface does not deviate by more than three times the root mean square roughness of the surface.

In one embodiment of the present application, each semiconductor fin (12L, 12R) has a height from 10 nm to 100 nm, and a width from 4 nm to 30 nm. Other fin heights and/or other fin widths that are lesser than, or greater than the aforementioned ranges may also be employed in the present application. Each semiconductor fin (12L, 12R) that is formed is oriented parallel to each other. Also, each semiconductor fin (12L, 12R) that is formed comprises the same crystalline semiconductor material as the upper semiconductor material portion of the bulk semiconductor substrate.

Figure 2:
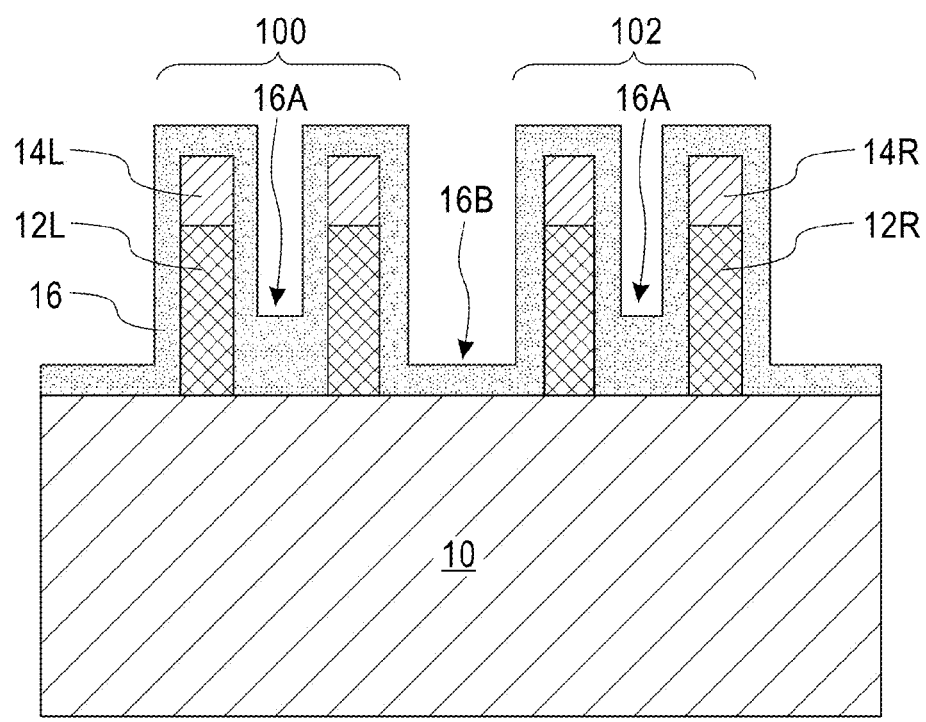
FIG. 2 is a cross sectional view of the exemplary semiconductor structure of FIG. 1 after forming a dielectric material liner.

Referring now to FIG. 2, there is illustrated the exemplary semiconductor structure of FIG. 1 after forming a dielectric material liner 16. The dielectric material liner 16 may comprise any dielectric material including, for example, silicon dioxide, silicon nitride and/or silicon oxynitride. In one embodiment, silicon nitride is employed as the dielectric material that provides the dielectric material liner 16. The dielectric material liner 16 has thicker dielectric material regions 16A that are located in the first gap mentioned above, and thinner dielectric material regions 16B that are located in the second gap mentioned above. The dielectric material liner 16 may be formed utilizing a deposition process such as, for example, chemical vapor deposition, plasma enhanced chemical vapor deposition, or physical vapor deposition. As is shown, the dielectric material liner 16 is a contiguous layer that covers the entirety of the exemplary semiconductor structure shown in FIG. 1.

Figure 3:
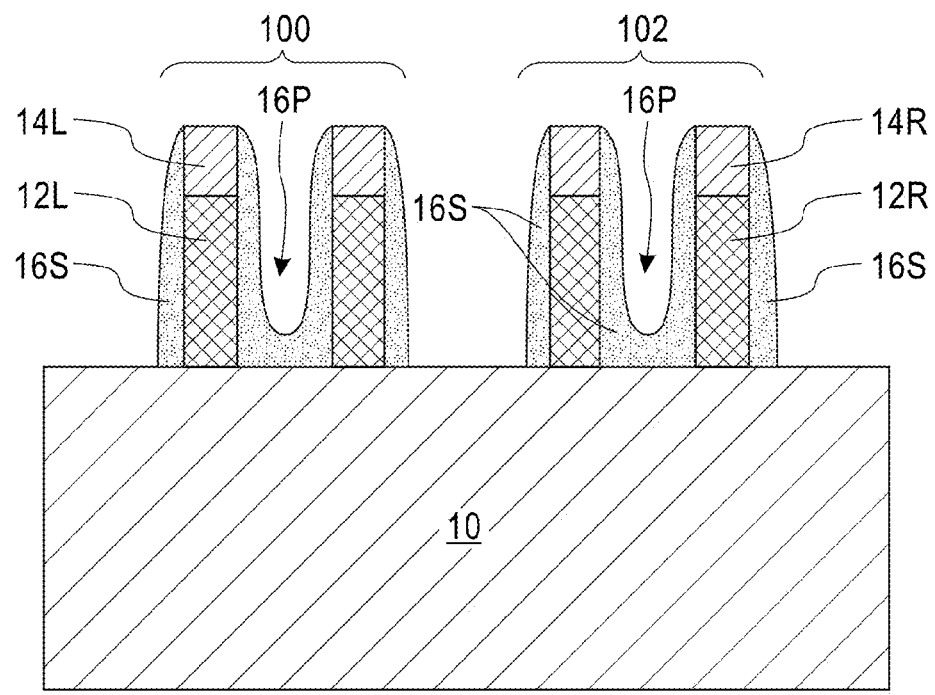
FIG. 3 is a cross sectional view of the exemplary semiconductor structure of FIG. 2 after patterning the dielectric material liner to provide a dielectric spacer along each sidewall of the first and second semiconductor fins.

Referring now to FIG. 3, there is illustrated the exemplary semiconductor structure of FIG. 2 after patterning the dielectric material liner 16 to provide a dielectric spacer 16S along each sidewall of the first and second semiconductor fins (12L, 12R). As is shown, portions of the thicker dielectric material regions 16A remain in the first gap after dielectric spacer 16S formation. The remaining portions of the thicker dielectric material regions 16A are referred to herein a dielectric material portion 16P. The patterning of the dielectric liner material 16 may include an etching process such as, for example, a reactive ion etch.

Figure 4:
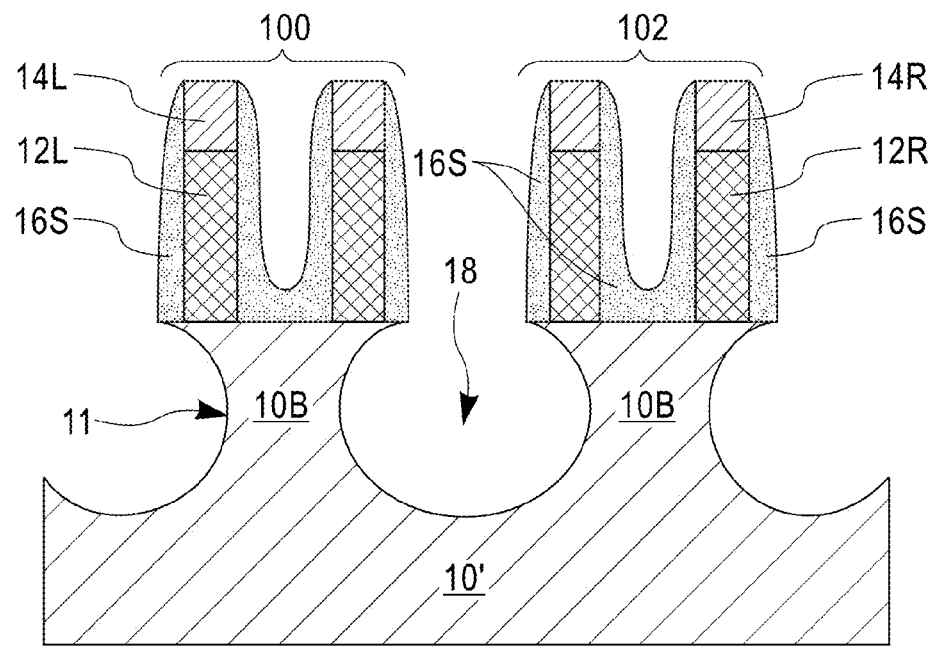
FIG. 4 is a cross sectional view of the exemplary semiconductor structure of FIG. 3 after removing exposed portions of the semiconductor substrate to provide a semiconductor base having concave sidewalls located beneath each of the first semiconductor fins and another semiconductor base having concave sidewalls is located beneath each of the second semiconductor fins.

Referring now to FIG. 4, there is illustrated the exemplary semiconductor structure of FIG. 3 after removing exposed portions of the semiconductor substrate 10 to provide a semiconductor base 10B having concave sidewalls 11 located beneath the pair of first semiconductor fins 12L and another semiconductor base 10B having concave sidewalls 11 located beneath the pair of second semiconductor fins 12R. A portion of semiconductor substrate 10 remains and is now labeled as 10' in FIG. 4. As is shown, openings 18 are formed into the semiconductor substrate 10. The openings 18 and each semiconductor base 10B may be formed utilizing an etching process. In one embodiment of the present application, the etch used to provide the openings 18 and each semiconductor base 10B may comprise an isotropic etch. In one example, a reactive ion etch can be employed. In another embodiment of the present application, the etch used to provide the openings 18 and each semiconductor base 10B may comprise an anisotropic etch (such as reactive ion etching), followed by an isotropic etch (such as a chemical wet etch process). As is shown, a sub-surface of semiconductor substrate 10' is exposed that is undulating (i.e., the sub-surface that is exposed is wavy. During this step of the present application, an undercut region is formed beneath the pair of first semiconductor fins 12L and beneath the pair of second semiconductor fins 12R.

Figure 5:
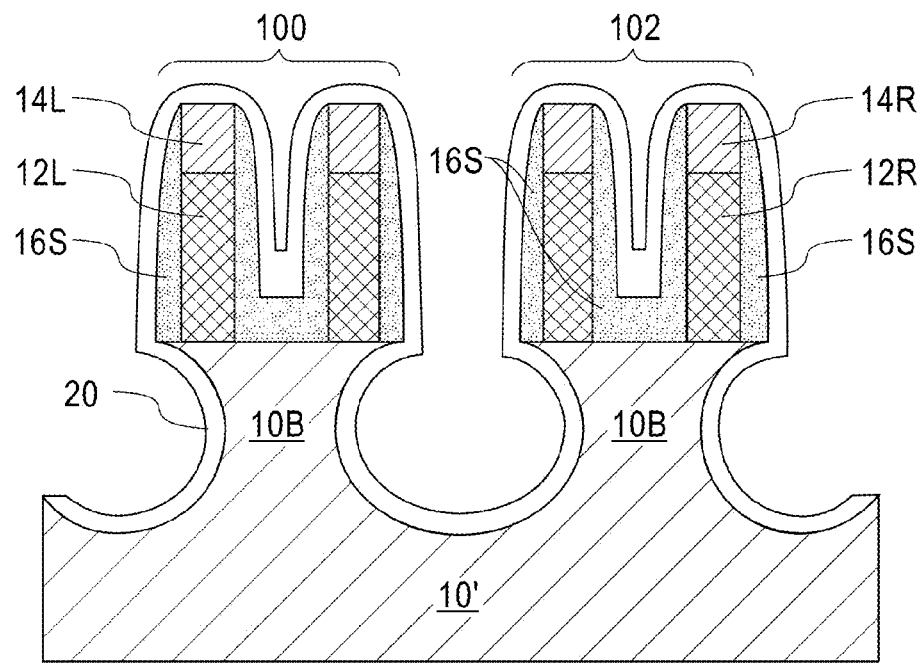
FIG. 5 is a cross sectional view of the exemplary semiconductor structure of FIG. 4 after forming a layer of a dopant source dielectric material.

Referring now to FIG. 5, there is illustrated the exemplary semiconductor structure of FIG. 4 after forming a layer of a dopant source dielectric material 20. The layer of dopant source dielectric material 20 includes a dielectric material and either an n-type dopant or a p-type dopant. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In one example, the layer of dopant source dielectric material 20 comprises borosilicate glass (BSG). In another embodiment, the layer of dopant source dielectric material 20 comprises phosphosilicate (PSG) glass. In one embodiment of the present application, the concentration of dopant within the layer of dopant source dielectric material 20 can range from 5E18 atoms/cm$^3$ to 5E21 atoms/cm$^3$, although dopant concentrations greater than 5E21 atoms/cm$^3$ or less than 5E18 atoms/cm$^3$ are also conceived.

The layer of dopant source dielectric material 20 is a contiguous layer that can be formed utilizing a deposition process such as, for example, chemical vapor deposition or plasma enhanced chemical deposition. The layer of dopant source dielectric material 20 may, in some embodiments, have a thickness from 1 nm to 10 nm. Other thicknesses that are lesser than, or greater than, the aforementioned thickness range can also employed so long as the thickness of the layer of dopant source dielectric material 20 is less than d1 or d2 mentioned above.

Figure 6:
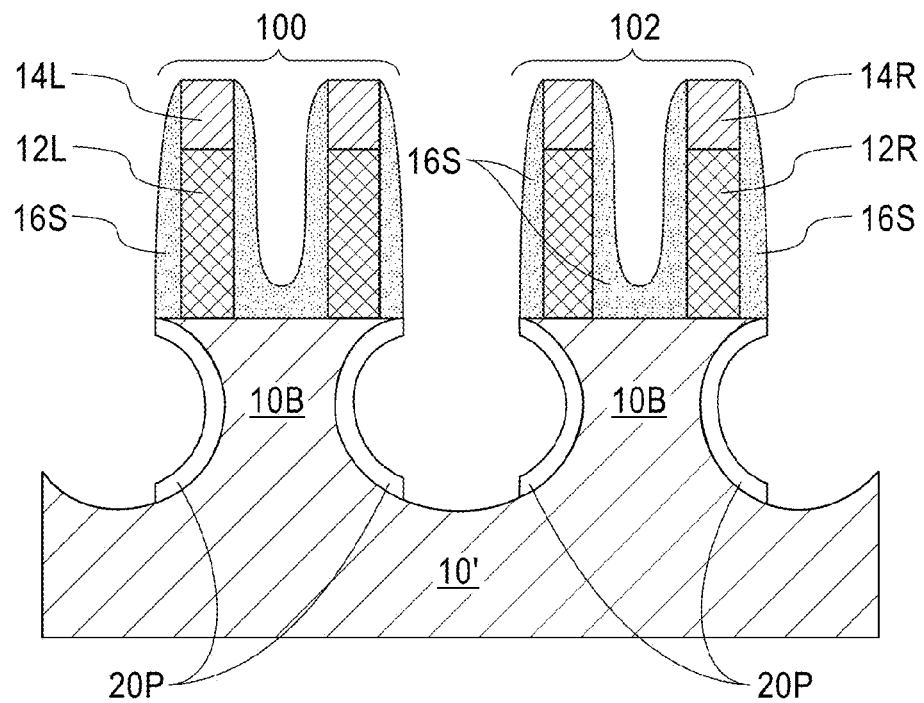
FIG. 6 is a cross sectional view of the exemplary semiconductor structure of FIG. 5 after patterning the layer of dopant source dielectric material to form dopant source dielectric material portions on each concave sidewall of each semiconductor base.

Referring now to FIG. 6, there is illustrated the exemplary semiconductor structure of FIG. 5 after patterning the layer of dopant source dielectric material 20 to form dopant source dielectric material portions 20P on each concave sidewall 11 of each semiconductor base 10B. The patterning of the layer of dopant source dielectric material 20 may include an etching process such as, for example, a reactive ion etch.

Figure 7:
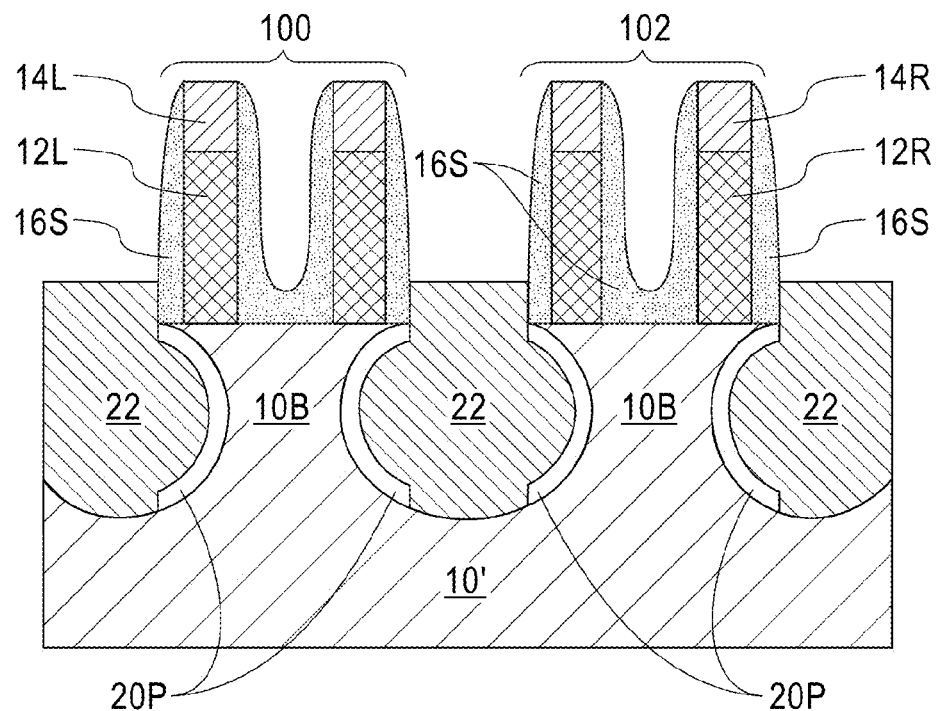
FIG. 7 is a cross sectional view of the exemplary semiconductor structure of FIG. 6 after forming a trench isolation structure.

Referring now to FIG. 7, there is illustrated the exemplary semiconductor structure of FIG. 6 after forming a trench isolation structure 22. The trench isolation structure 22 includes a trench dielectric material such as, for example, a trench oxide. The trench dielectric material can be formed utilizing a deposition process such as, for example, chemical vapor deposition or plasma enhanced chemical vapor deposition. An anneal step may follow the deposition of the trench dielectric material so as to densify the deposited trench dielectric material. In some embodiments of the present application, the deposited trench dielectric material may be subjected to a planarization process such as, for example, chemical mechanical polishing or an etch back process.

In some embodiments and as shown, the topmost surface of the trench isolation structure 22 may be located above a topmost surface of each semiconductor base 10B, but lower than a topmost surface of each semiconductor fin (12L, 12R). In other embodiments, the topmost surface of the trench isolation structure 22 may be coplanar with, or located beneath, a topmost surface of each semiconductor base 10B.

As is shown, a bottommost surface of the trench isolation structure 22 is in direct physical contact with the exposed undulating surface of semiconductor substrate 10'. As is further shown, the trench isolation structure 22 is spaced apart from the base semiconductor 10B by the dopant source dielectric material portion 20P.

Figure 8:
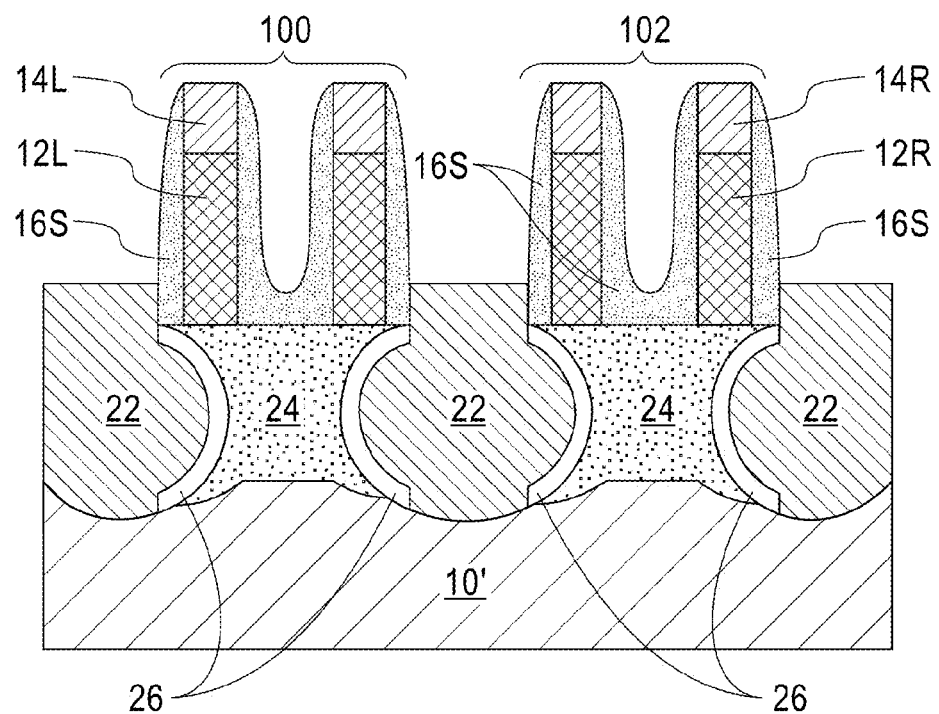
FIG. 8 is a cross sectional view of the exemplary semiconductor structure of FIG. 7 after performing an anneal to diffuse dopant from each dopant source dielectric material portion into each semiconductor base to convert each semiconductor base into a punch-through stop base structure.

Referring now to FIG. 8, there is illustrated the exemplary semiconductor structure of FIG. 7 after performing an anneal to diffuse dopant from each dopant source dielectric material portion 20P into each semiconductor base 10B to convert each semiconductor base 10B into a punch-through stop base structure 24. After diffusion dopant from the dopant source dielectric material portion 20P, the dopant source material dielectric portion 20P that remains has a lesser dopant concentration than the original layer of dopant source dielectric material 20. The dopant deficient dopant source dielectric material portions 20P are now referred to herein as a dopant source dielectric material liner 26.

In one embodiment, the anneal that is employed to diffuse dopant from each dopant source dielectric material portion 20P into each semiconductor base 10B is a thermal anneal. In such an embodiment, the thermal anneal can be performed in an inert ambient such as, for example, helium and/or argon. In one embodiment of the present application, the thermal anneal can be performed at a temperature that is sufficient to drive dopant from the dopant source material dielectric portion 20P into the semiconductor base 10B. In one embodiment, the thermal anneal temperature may range from 700° C. to 1300° C. The duration of the anneal can vary and in one embodiment can be from 10 nanoseconds to 2 hours. The thermal anneal may be performed at a constant temperature or various ramp and soak heating cycles may be used. In addition to thermal annealing, the present application works with other types of annealing process including, but not limited to, laser annealing or flash annealing.

The punch-through stop base structure 24 that is formed has the same shape (i.e., barrel shape) as the semiconductor base 10B and has outermost sidewalls that are concave. The punch-through stop base structure 24 contains an upper portion of a first width, a middle portion of a second width that is less than the first width and a lower portion of the first width. The punch-through stop base structure 24 typically has a dopant concentration of from 1E18 atoms/cm$^3$ to 5E19 atoms/cm$^3$.

Notably, FIG. 8 (and also FIGS. 9-10 below) shows a semiconductor structure in accordance with the present application. The semiconductor structure includes at least one punch-through stop base structure 24 having concave outermost sidewalls and located on a semiconductor surface of a semiconductor substrate 10'. The structure further includes a pair of semiconductor fins (12L in first device region 100 or 12R in second device region 102) extending upwards from a topmost surface of the at least one punch through stop base structure 24. The structure even further includes a trench isolation structure 22 located laterally adjacent each of the concave outermost sidewalls of the at least one punch-through stop base structure 24, wherein a dopant source dielectric material portion 26 is located on each of the concave outermost sidewalls of the at least one punch-through stop base structure 24 and is present between the at least one punch-through stop base structure 24 and the trench isolation structure 22. In the present application each of the semiconductor substrate 10', the semiconductor fins (12L, 14L) and the punch-through stop base structures comprises a crystalline semiconductor material such as, for example crystalline silicon.

Figure 9:
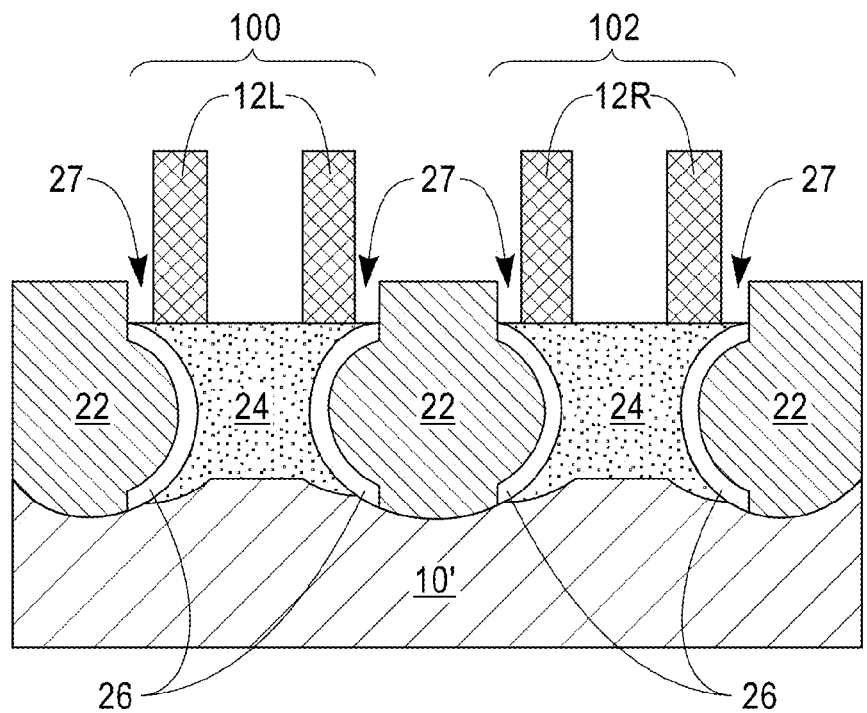
FIG. 9 is a cross sectional view of the exemplary semiconductor structure of FIG. 8 after removing each spacer and each hard mask cap.

Referring now to FIG. 9, there is illustrated the exemplary semiconductor structure of FIG. 8 after removing each spacer 16S (including the dielectric material portion 16P) and each hard mask cap (14L, 14R). In some embodiments of the present application, each hard mask cap (14L, 14R) may be maintained atop each semiconductor fin (12L, 12R) and be present during the formation of functional gate structure (to be defined below).

Each spacer 16S (including the dielectric material portion 16P) can be removed utilizing an etching process that is selective in removing the dielectric material that provides each spacer 16S and the dielectric material portion 16P. In one example, and when silicon nitride is employed as the dielectric material of each spacer 16S and the dielectric material portion 16P, an aqueous solution containing phosphoric acid can be used as the etchant. After removing each spacer 16S and the dielectric material portion 16P, divot 27 is formed. In some embodiments, and as is shown, the divot 27 is located between a bottom portion of a sidewall surface of each semiconductor fin within a pair of semiconductor fins and a portion of the trench isolation structure.

In some embodiments, each hard mask cap (14L, 14R) may be removed at the same time and with the same etchant as used to remove each spacer 16S and the dielectric material portion 16P. In another embodiment, each hard mask cap (14L, 14R) can be removed prior to, or after, removing each spacer 16S and the dielectric material portion 16P. In such an embodiment, each hard mask cap (14L, 14R) can be removed utilizing an etching process or a planarization process (such as chemical mechanical polishing).

Figure 10:
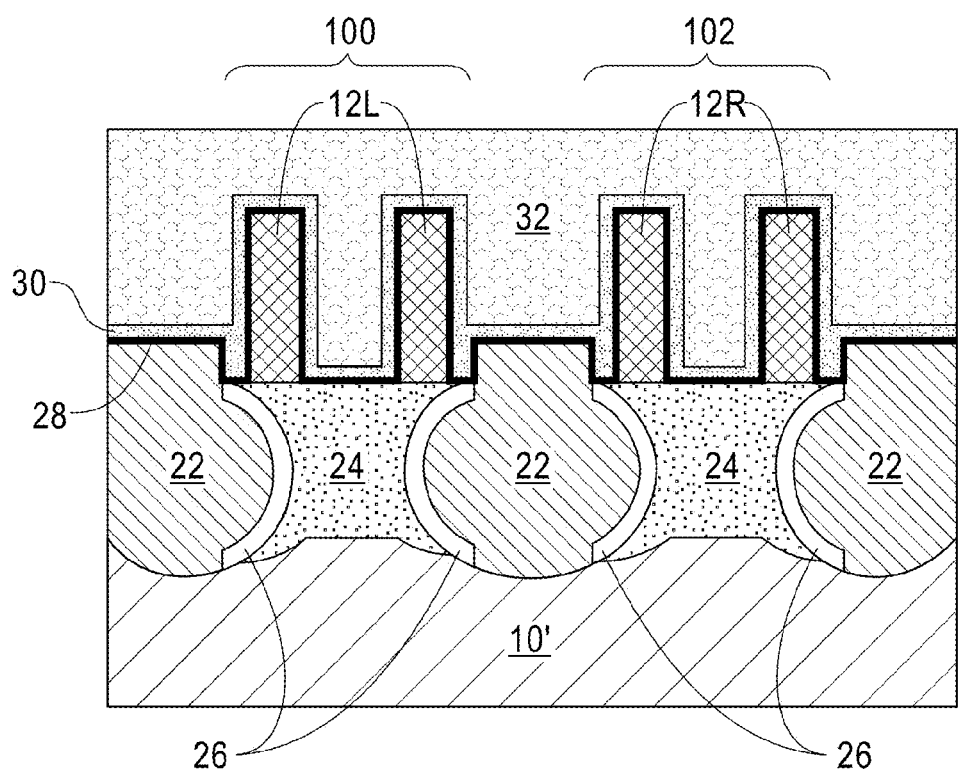
FIG. 10 is a cross sectional view of the exemplary semiconductor structure of FIG. 9 after forming a functional gate structure.

Referring now to FIG. 10, there is illustrated the exemplary semiconductor structure of FIG. 9 after forming a functional gate structure. The functional gate structure straddles over a portion of each semiconductor fin 12L in first device region 100 and over a portion of each semiconductor fin 12R in the second device region 102. The term "functional gate structure" denotes a permanent gate structure used to control output current (i.e., flow of carries in a channel) of a semiconducting device through electrical or magnetic fields.

In some embodiments, a single functional gate structure can be formed. In other embodiments, multiple functional gate structure can be formed. In some embodiments, each functional gate structure within the first device region 100 and second device region 102 contains the same materials. In other embodiments, the functional gate structure(s) within the first device region 100 and second device region 102 contain(s) at least one different material. In accordance with the present application, each punch-through stop base structure 24 is self-aligned beneath the channel region of a functional gate structure.

In one embodiment and as shown, the functional gate structure includes, from bottom to top, a gate dielectric portion 28, a workfunction metal portion 30 and a metal gate portion 32. In some embodiments, the workfunction metal portion 30 may be omitted. In such an embodiment, the metal gate portion 32 may include other conductive materials such as, for example, doped polysilicon or doped polySiGe. Collectively, the workfunction metal portion and the metal gate portion provide a gate conductor portion of the functional gate structure. In some embodiments, and as shown, at least the gate dielectric material portion 28 is present in divots 27 provided above.

The functional gate structure can be formed utilizing a gate-first or a gate-last process. In a gate first process, the functional gate structure is formed first followed by the source/drain regions and optionally, merging of each of the source/drain regions. In a gate-last process, the gate structure is formed after source/drain regions are formed. In such a process, a sacrificial gate material is formed straddling an exposed portion of each semiconductor fin. Source/drain regions are then formed by utilizing processes well known to those skilled in the art. Next, the sacrificial gate structure may be replaced with a functional gate structure as defined above.

The gate dielectric material that provides the gate dielectric material portion 28 can be an oxide, nitride, and/or oxynitride. In one example, the gate dielectric material that provides the gate dielectric material portion 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric material used in providing the gate dielectric material portions 28 can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material portion 28. When a different gate dielectric material is used for the gate dielectric material portions of different functional gate structures, block mask technology can be used. In one embodiment of the present application, the gate dielectric material used in providing the gate dielectric material portion 28 can have a thickness in a range from 1 nm to 10 nm. Other thicknesses that are lesser than or greater than the aforementioned thickness range can also be employed for the gate dielectric material.

The gate conductor portion comprises a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material portion may comprise an nFET gate metal. In other embodiments, the gate conductor material portion may comprise a pFET gate metal.

When a workfunction metal portion 30 is employed as part of the gate conductor portion, the workfuction metal portion 30 may include a workfunction metal such as for example, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials.

When a metal gate portion 32 is employed, the metal gate portion 32 may include an elemental metal or alloy of at least two elemental metals, as mention above with respect to the gate conductor portion of each functional gate structure. In one embodiment, the metal gate portion 32 may include a metal with a lower resistivity (higher conductivity) than the workfunction metal portion 30, including, for example tungsten (W) or aluminum (Al).

The gate conductor material (including the workfunction metal portion and metal gate portion) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used.

In some embodiment, the gate conductor material (including a workfunction metal and metal gate) may be patterned after formation thereof utilizing lithography and etching. A dielectric spacer material may then be formed on the functional thereafter the dielectric spacer material can be etched to form dielectric spacers on exposed sidewall surfaces of the functional gate structure. Source/drain regions (not shown) can be formed in portions of each semiconductor fin 12L, 12R, that are not covered by the functional gate structure and, if present, the dielectric spacer. The source/drain regions can be formed utilizing processes that are well known to those skilled in the art.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    at least one punch-through stop base structure having concave outermost sidewalls and located on a semiconductor surface of a semiconductor substrate;
    a pair of semiconductor fins extending upwards from a topmost surface of said at least one punch through stop base structure; and
    a trench isolation structure located laterally adjacent each of said concave outermost sidewalls of said at least one punch-through stop base structure, wherein a dopant source dielectric material liner is located on each of said concave outermost sidewalls of said at least one punch-through stop base structure and is present between said at least one punch-through stop base structure and said trench isolation structure.

2. The semiconductor structure of claim 1, wherein a topmost surface of said trench isolation structure extends above said topmost surface of said at least one punch-through stop base structure.

3. The semiconductor structure of claim 1, wherein a divot is located between a bottom portion of a sidewall surface of each semiconductor fin of said pair of semiconductor fins and a portion of said trench isolation structure.

4. The semiconductor structure of claim 3, wherein at least a gate dielectric portion of a functional gate structure is present in said divot.

5. The semiconductor structure of claim 1, wherein said at least one punch-through stop base structure comprises a crystalline semiconductor material containing an n-type or p-type dopant.

6. The semiconductor structure of claim 1, wherein said at least one punch-through stop base structure, said semiconductor substrate and each of said semiconductor fins of said pair of semiconductor fins comprises a same semiconductor material.

7. The semiconductor structure of claim 1, wherein said dopant source dielectric material liner comprises borosilicate glass or phosphosilicate glass.

8. The semiconductor structure of claim 1, wherein a bottommost surface of said trench isolation structure is in direct physical contact with a portion of said semiconductor surface of said semiconductor substrate.

9. The semiconductor structure of claim 1, wherein said at least one punch-through stop base structure contains an upper portion of a first width, a middle portion of a second width that is less than said first width and a lower portion of said first width.

10. The semiconductor structure of claim 1, further comprising a functional gate structure straddling over a portion of said pair of semiconductor fins.

11. A method of forming a semiconductor structure, said method comprising:
    forming at least one pair of semiconductor fins extends upwards from a semiconductor surface of a semiconductor substrate, wherein each semiconductor fin of said at least one pair of semiconductor fins is separated by a gap;
    forming a dielectric spacer along sidewalls of each semiconductor fin of said at least one pair of semiconductor fins, wherein a dielectric material portion of said dielectric spacer covers an entirety of said semiconductor surface of said semiconductor substrate within said gap;
    removing exposed portions of said semiconductor substrate to provide a semiconductor base having concave outermost sidewalls located beneath said at least one pair of semiconductor fins utilizing said dielectric spacer as an etch mask;
    forming a dopant source dielectric material portion on each of said concave outermost sidewall of each semiconductor base;
    forming a trench isolation structure laterally adjacent each semiconductor base, wherein said dopant source dielectric material portion separates said trench isolation structure from said semiconductor base; and
    diffusing dopant from each dopant source dielectric material portion into said semiconductor base to convert said semiconductor base into a punch-through stop base structure.

12. The method of claim 11, further comprising removing said dielectric spacer and said dielectric material portion after said diffusing said dopant into said semiconductor base.

13. The method of claim 12, wherein a divot is formed between a bottom portion of a sidewall surface of each semiconductor fin of said at least one pair of semiconductor fins and a portion of said trench isolation structure.

14. The method of claim 13, further comprising forming a functional gate structure straddling over a portion of each semiconductor fin, wherein at least a gate dielectric portion of said functional gate structure is present in said divot.

15. The method of claim 11, wherein said removing said exposed portions of said semiconductor substrate comprises etching.

16. The method of claim 15, wherein said etching comprises an isotropic etch or a combination of anisotropic and isotropic etching.

17. The method of claim 11, wherein a topmost surface of said trench isolation structure extends above a topmost surface of said at least one punch-through stop base structure.

18. The method of claim 11, wherein said forming said at least one pair of semiconductor fins comprises:
   forming a hard mask layer on a surface of a bulk semiconductor substrate; and
   patterning said hard mask layer and an upper semiconductor portion of said bulk semiconductor substrate.

19. The method of claim 11, wherein said punch-through stop base structure contains an upper portion of a first width, a middle portion of a second width that is less than said first width and a lower portion of said first width.

20. The method of claim 11, wherein said semiconductor substrate, said semiconductor fins, said semiconductor base and said punch-through stop base structure comprise a crystalline semiconductor material.

* * * * *